(12) United States Patent
Huang et al.

(10) Patent No.: US 8,467,891 B2
(45) Date of Patent: Jun. 18, 2013

(54) METHOD AND SYSTEM FOR EFFICIENT OPTIMIZATION OF AUDIO SAMPLING RATE CONVERSION

(75) Inventors: Zhenhua Huang, Hunan (CN); Donald Edward Becker, Bradenton, FL (US); Baohua Shu, Shanghai (CN); Laigui Qin, Sichuan (CN); Xiao Luo, Hubei (CN); Rongbin Qiu, Shanghai (CN)

(73) Assignee: UTC Fire & Security Americas Corporation, Inc., Bradenton, FL (US)

( * ) Notice: Subject to any disclaimer, the term of this patent is extended or adjusted under 35 U.S.C. 154(b) by 1185 days.

(21) Appl. No.: 12/356,682

(22) Filed: Jan. 21, 2009

(65) Prior Publication Data

US 2010/0185450 A1     Jul. 22, 2010

(51) Int. Cl.
    *G06F 17/00* (2006.01)
(52) U.S. Cl.
    USPC ........................................................ 700/94
(58) Field of Classification Search
    USPC ........ 700/94; 708/313; 341/61; 704/500–504
    See application file for complete search history.

(56) References Cited

U.S. PATENT DOCUMENTS

| 4,972,357 | A | * | 11/1990 | Morel ........................... 708/313 |
| 5,157,395 | A | * | 10/1992 | Del Signore et al. ......... 341/143 |
| 5,748,126 | A | | 5/1998 | Ma et al. |
| 6,236,283 | B1 | | 5/2001 | Koslov |
| 6,917,318 | B2 | | 7/2005 | Lambert |
| 7,126,505 | B2 | | 10/2006 | Avantaggiati |
| 7,378,995 | B2 | | 5/2008 | Chen |
| 2007/0040713 | A1 | | 2/2007 | Chen |
| 2009/0319065 | A1 | * | 12/2009 | Risbo ............................. 700/94 |

OTHER PUBLICATIONS

Alan V. Oppenheim et al., Discrete-Time Signal Processing 167-80, 439-40, 576-77 (2d ed., Prentice Hall, 1999).*
Mottaghi-Kashtiban et al., Optimum Structures for Sample Rate Conversion from CD to DAT and DAT to CD Using Multistage Interpolation and Decimation, 2006 IEEE International Symposium on Signal Processing and Information Technology, Aug. 2006, pp. 633-637.

* cited by examiner

*Primary Examiner* — Andrew C Flanders
(74) *Attorney, Agent, or Firm* — MH2 Technology Law Group, LLP

(57) ABSTRACT

A controller for outputting audio having a predetermined output sample rate. The controller is programmed to receive an audio signal having a first sample rate, identify the first sample rate of the audio signal, select a converter based on the identification of the first sample rate, and convert the sample rate of the received audio signal to the predetermined output sample rate.

8 Claims, 4 Drawing Sheets

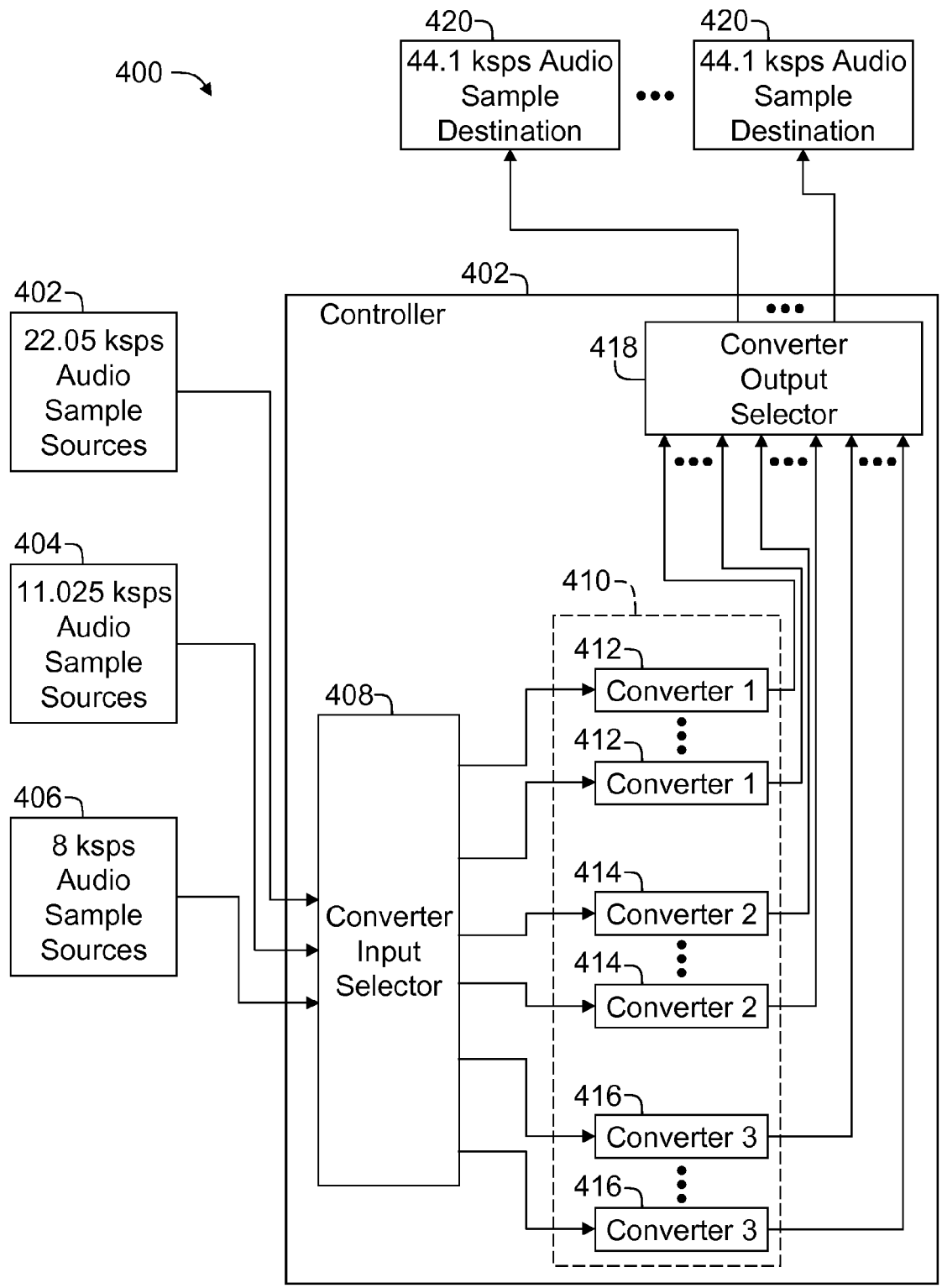

METHOD AND SYSTEM FOR EFFICIENT OPTIMIZATION OF AUDIO SAMPLING RATE CONVERSION

BACKGROUND OF THE INVENTION

1. Field of the Invention

The subject matter disclosed herein relates generally to audio communications, and more particularly, to improving the efficiency of an audio sample rate converter system used to convert multiple audio sample rates to a specific sample rate for use in various systems where such a specific sample rate is desired.

2. Description of the Prior Art

The sampling rate of a digital signal can be changed using interpolators and decimators. Straight implementation of decimation and interpolation is the simplest method, but can require substantial computational resources making it unsuitable for systems with limited processing resources. Some present systems use complex multi-stage structures to convert the sample rate of an audio signal as to reduce the need for computational resources. However, these more complex systems may induce audio distortion after the audio sample rate conversion.

Accordingly, it is desirable to provide systems and methods for converting the sample rate of audio signals using an efficient converter structure to retain the audio quality of the sample yet reduce the computational resources necessary for the conversion.

BRIEF SUMMARY OF THE INVENTION

In one aspect, a controller for outputting audio having a predetermined output sample rate is programmed to receive an audio signal having a first sample rate, identify the first sample rate of the audio signal, select a converter based on the identification of the first sample rate, and convert the sample rate of the received audio signal to the predetermined output sample rate.

In another aspect, an audio sample rate conversion system for outputting audio having a predetermined output sample rate includes an audio sample signal source, at least one audio sample rate converter configured to convert a first sample rate of an audio signal to a predetermined output sample rate, and an audio controller. The audio controller is coupled to at least one audio sample rate converter and to the audio sample signal source. Further, the audio controller is programmed to receive the audio signal having the first sample rate from the audio sample signal source, identify the first sample rate of the audio signal, select a first audio sample rate converter from the at least one audio sample rate converter based on the identification of the first sample rate of the audio signal, and output the audio signal having the first sample rate to the first audio sample rate converter.

In yet another aspect, a method for converting a first sample rate of an audio signal to a predetermined output sample rate includes receiving the audio signal having the first sample rate, identifying the first sample rate of the audio signal, selecting a converter from at least one audio sample rate converter based on the identification of the first sample rate of the audio signal, and converting the first sample rate of the audio signal to the predetermined output sample rate.

BRIEF DESCRIPTION OF THE DRAWINGS

FIGS. 1-4 show exemplary embodiments of the method and system described herein.

FIG. 1 is a schematic diagram of an exemplary controller for converting an audio signal having a first sample rate to a predetermined output sample rate.

FIG. 2 is a schematic diagram of an exemplary audio sample rate conversion system.

FIG. 3 is a flowchart of an exemplary method for converting a first sample rate of an audio signal to a predetermined output sample rate.

FIG. 4 illustrates an exemplary implementation of an audio sample rate conversion system for converting a first sample rate of an audio signal to a predetermined output sample rate such that computational resources are reduced while retaining the audio quality of audio signal.

DETAILED DESCRIPTION OF THE INVENTION

A controller, such as described herein, includes one or more processors or processing units and a system memory. The controller typically also includes at least some form of computer readable media. By way of example and not limitation, computer readable media may include computer storage media and communication media. Computer storage media may include volatile and nonvolatile, removable and non-removable media implemented in any method or technology that enables storage of information, such as computer readable instructions, data structures, program modules, or other data. Communication media typically embody computer readable instructions, data structures, program modules, or other data in a modulated data signal such as a carrier wave or other transport mechanism and include any information delivery media. Those skilled in the art should be familiar with the modulated data signal, which has one or more of its characteristics set or changed in such a manner as to encode information in the signal. Combinations of any of the above are also included within the scope of computer readable media.

Technical effects of the methods, systems, and controllers described herein include at least one of: receiving the audio signal having a first sample rate; identifying the first sample rate of the audio signal; selecting a converter from one or more audio sample rate converters based on identifying the first sample rate of the audio signal; converting the first sample rate of the audio signal to a predetermined output sample rate; receiving the audio signal having a sample rate less than the predetermined output sample rate; converting the first sample rate of the audio signal to a predetermined output sample rate; converting the first sample rate of the audio signal to the predetermined output sample rate of approximately 44.1 kilo samples per second (ksps); and receiving the audio signal having a first sample rate equal to one of approximately 8 ksps, approximately 11.025 ksps, and approximately 22.05 ksps.

Referring to FIGS. 1-4, embodiments described herein convert the sample rate of one or more received audio signals to a predetermined output sample rate. An exemplary controller 100 includes one or more audio sample rate converters, such as audio sample rate converters 106, 108 and 110, configured to convert different sample rates for audio signals to the predetermined output sample rate. In certain embodiments, controller 100 is configured to convert one or more audio samples having input sample rates to one predetermined output sample rate to provide a consistent sample rate for an audio sample destination 114 that benefits from receiving audio samples with the predetermined output sample rate.

Figure 1:
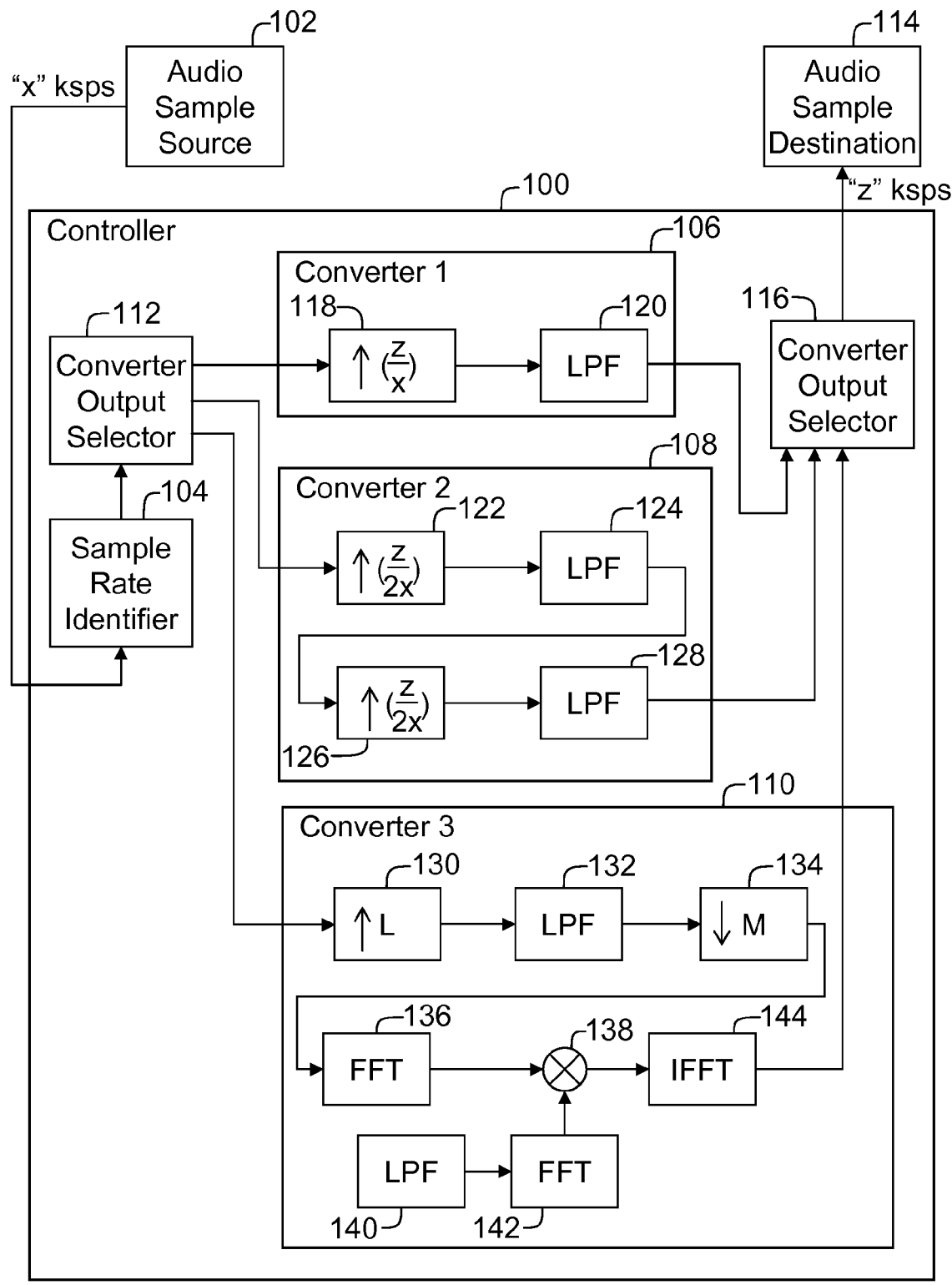

Referring further to FIG. 1, a schematic diagram illustrates an exemplary controller 100 for converting an audio signal that has a first sample rate, and that is received from an audio sample source 102. In the exemplary embodiment, controller 100 identifies the first sample rate of the audio signal using a sample rate identifier 104. Moreover, upon identifying the first sample rate, controller 100 selects one converter 106, 108 or 110 using a converter input selector 112. Further, selected converter 106, 108 or 110, converts the first sample rate of the audio signal to the predetermined output sample rate for output to the audio sample destination 114 using a converter output selector 116. In the exemplary embodiment, the first sample rate of the audio signal received from audio sample source 102 includes a sample rate that is less than the predetermined output sample rate.

In the exemplary embodiment, converter 106 includes an interpolator module 118 that increases the sample rate of the audio signal by a factor equal to a ratio of the predetermined output sample rate to the first sample rate. In one embodiment, the predetermined output sample rate is 44.1 ksps, and the first sample rate is 22.05 ksps, which yields an interpolator ratio (L-factor) of two (2), meaning interpolator module 118 inserts a single zero (0) between samples. Further, converter 106 includes a low-pass filter module 120 that multiplies an output of interpolator module 118 by samples of an impulse response of a low-pass filter (not shown), having a sample rate equal to the output of interpolator module 118. Converter 106 also includes a decimator module (not shown) that decreases the sample rate of an output of low-pass filter module 120. In the exemplary embodiment, the decimator module included in converter 106 and converter 108 has a decimator ratio (M-factor) of one (1), which does not affect the sample rate of the output of low-pass filter module 120. Therefore, the decimator is not shown in converters 106 and 108.

In the exemplary embodiment, low-pass filter module 120 includes a linear digital filter with a cutoff frequency equal to a minimum of one or more of ($\pi$/L) and ($\pi$/M), where L is the interpolator ratio and M is the decimator ratio. The filter order (N) is determined using the following equation:

$$N \geq \frac{p * F_{IN}}{f_S - f_P}$$ Eq. (1)

where $f_P$ is a pass band cutoff frequency in Hertz, $f_S$ is a stop band cutoff frequency in Hertz, $\delta_S$ is a stop band ripple in dB, $\delta_P$ is a pass band ripple in dB, and p is determined using the following formula:

$$p = \begin{cases} 0.9222, & \delta s \geq -21 \text{ dB} \\ \frac{-\delta s - 7.95}{14.36}, & \delta s < -21 \text{ dB} \end{cases}$$ Eq. (2)

The above formula provides that p is a constant 0.9222 when the stop band ripple $\delta_S$ is greater than −21 dB, and p is determined by the equation when the stop band ripple $\delta_S$ is less than −21 dB. In the exemplary embodiment, the stop band ripple $\delta_S$ is −3 dB and the pass band ripple $\delta_P$ is −60 dB. In alternative embodiments, the pass band ripple $\delta_P$, the stop band ripple $\delta_S$, the pass band cutoff frequency $f_P$, and the stop band cutoff frequency $f_S$ include any suitable combination of values and frequencies known to those skilled in the art and guided by the teachings herein provided that are capable of performing the filtering functions as described herein.

Further, in the exemplary embodiment, converter 108 includes a first interpolator module 122 that increases the sample rate of the audio signal by a factor equal to a ratio of one-half of the predetermined output sample rate to the first sample rate. In one embodiment, the predetermined output sample rate is 44.1 ksps, and the first sample rate is 11.025 ksps, which yields an interpolator ratio (L-factor) of two (2). Further, converter 108 includes a first low-pass filter module 124 that multiplies the output of first interpolator module 122 by samples of an impulse response of a low-pass filter (not shown), having a sample rate equal to the output of first interpolator module 122. In addition, converter 108 includes a second interpolator module 126 functionally equivalent to first interpolator module 122, and a second low-pass filter module 128 functionally equivalent to first low-pass filter module 124. By using multiple matching interpolator/low-pass filter sets operatively coupled in series, the complexity of converter 108 is reduced while still achieving the predetermined output sample rate.

Converter 110, in the exemplary embodiment, includes a first step filter (not shown) that includes an interpolator module 130, a first low-pass filter module 132, and a decimator module 134. In such an embodiment, interpolator module 130 increases the first sample rate of the audio signal by a factor of L equal to a least common numerator of a ratio of the predetermined output sample rate to the first sample rate, and outputs to a second sample rate. In the exemplary embodiment, the predetermined output sample rate is 44.1 ksps and the first sample rate is 8.0 ksps, which yields an interpolator ratio (L-factor) of 441. Moreover, in such an embodiment, first low-pass filter module 132 multiplies the output of interpolator module 130 by samples of an impulse response of a low-pass filter (not shown) having a sample rate equal to the second sample rate output of interpolator module 130. Further, in such an embodiment, decimator module 134 decreases the sample rate of the audio signal at the second sample rate by a factor of M equal to a least common denominator of the ratio of the predetermined output sample rate to the first sample rate and outputs at a third sample rate equal to the predetermined output sample rate.

Further, in the exemplary embodiment, converter 110 includes a second step filter (not shown) that includes a first fast-Fourier transform (FFT) module 136, a multiplier junction 138, a second low-pass filter module 140, a second FFT module 142, and an inverse FFT module 144. In such an embodiment, first fast-Fourier transform (FFT) module 136 transforms the audio signal at the third sample rate output from decimator module 134 from the time domain to the frequency domain. Moreover, in such an embodiment, second low-pass filter module 140 outputs samples of a low-pass filter at a sample rate equal to the third sample rate of the audio signal output from decimator module 134. Further, second fast-Fourier transform (FFT) module 142 outputs a frequency domain representation of the samples received from low-pass filter module 140, and multiplier junction 138 multiplies the output of FFT module 136 by the output of FFT module 142. The product of the multiplication is output to an inverse fast-Fourier transform (IFFT) module 144 that transforms the frequency domain audio signal output from multiplier junction 138 into a time domain audio signal at the predetermined output sample rate. Upon converting the audio signal from the first sample rate to the predetermined output sample rate, controller 100 selects output from one or more of converters 106, 108 and 110, using converter output selector 116, and outputs the audio signal at the predetermined output sample rate.

Components of controller 100, including sample rate identifier 104, converters 106, 108 and 110, converter input selector 112, and converter output selector 116, are shown schematically as blocks in FIG. 1. In the exemplary embodiment, one or more components of controller 100 are implemented as software. In an alternative embodiment, one or more components of controller 100 are separate hardware components of controller 100. In further alternative embodiments, one or more components of controller 100 include any suitable combination of hardware and software known to those skilled in the art and guided by the teachings herein provided that are capable of performing the functions as described herein.

Figure 2:
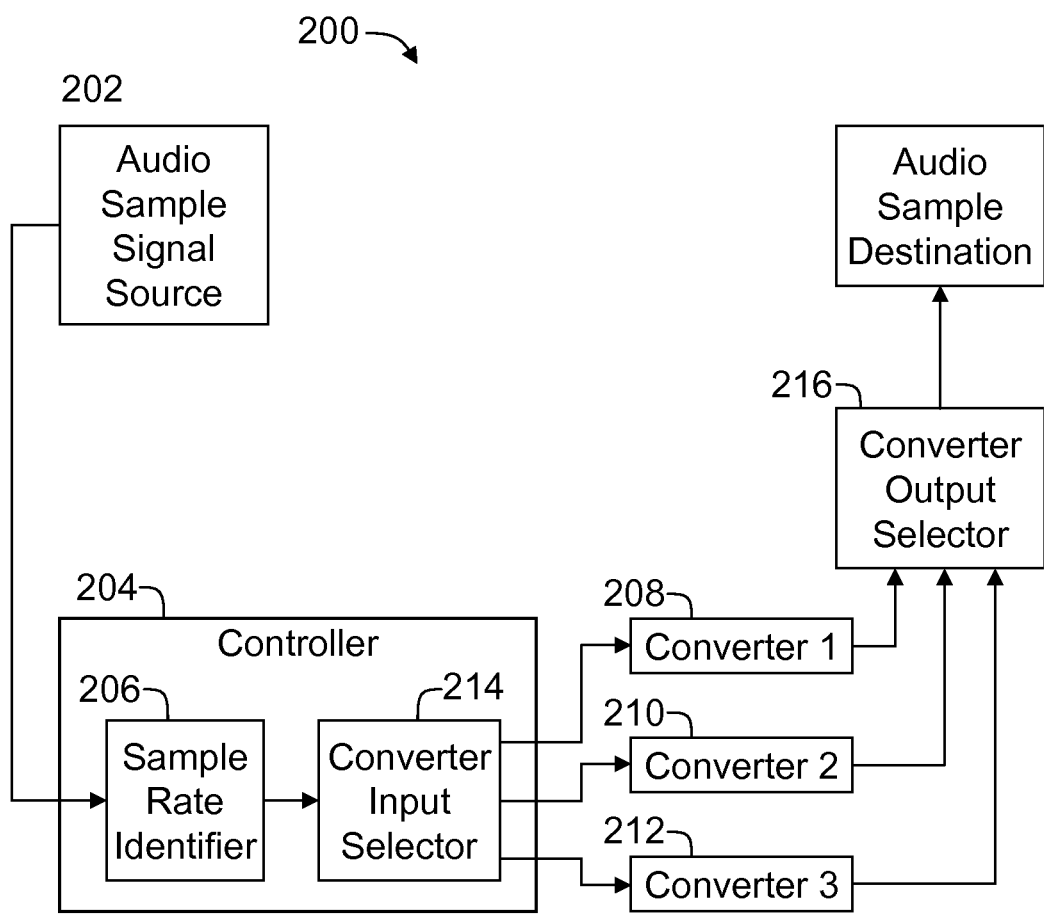

Referring further to FIG. 2, a schematic diagram illustrates an exemplary audio sample rate conversion system 200 for converting a first sample rate of an audio signal received from an audio sample signal source 202 to a predetermined output sample rate. In the exemplary embodiment, audio sample rate conversion system 200 includes a controller 204 and a sample rate identifier 206 that identifies the first sample rate of the audio signal. In such an embodiment, audio sample rate conversion system 200 is capable of receiving a plurality of audio signals each having a sample rate to be identified. After identifying the first sample rate, controller 204 selects one or more of converters 208, 210 and 212 using a converter input selector 214, and controller 204 outputs the audio signal having the first sample rate to the selected one or more converters 208, 210 and 212. In the exemplary embodiment, converter 208 is functionally identical to converter 106 (shown in FIG. 1), converter 210 is functionally identical to converter 108 (shown in FIG. 1), and converter 212 is functionally identical to converter 110 (shown in FIG. 1). In the exemplary embodiment, converters 208, 210 and 212 are separate devices from controller 204. In an alternative embodiment, controller 204 includes converters 208, 210 and 212. Upon the conversion of the audio signal from the first sample rate to the predetermined output sample rate, in the exemplary embodiment, audio sample rate conversion system 200 selects the output from one or more of converters 208, 210 and 212 using converter output selector 216, and outputs the audio signal at the predetermined output sample rate. In the exemplary embodiment, the predetermined output sample rate is approximately 44.1 ksps, and the first sample rate is approximately 11.025 ksps. In alternative embodiments, the first sample rate is one of approximately 8 ksps and approximately 22.05 ksps.

Components of audio sample rate conversion system 200, including controller 204, sample rate identifier 206, converter input selector 214, as well as converters 208, 210 and 212, and converter output selector 116, are shown schematically as blocks in FIG. 2. In the exemplary embodiment, one or more components of audio sample rate conversion system 200 are implemented as software. In an alternative embodiment, one or more components of audio sample rate conversion system 200 are each separate hardware components. In further alternative embodiments, one or more components of audio sample rate conversion system 200 include any suitable combination of hardware and software known to those skilled in the art and guided by the teachings herein provided that are capable of performing the functions as described herein.

Figure 3:
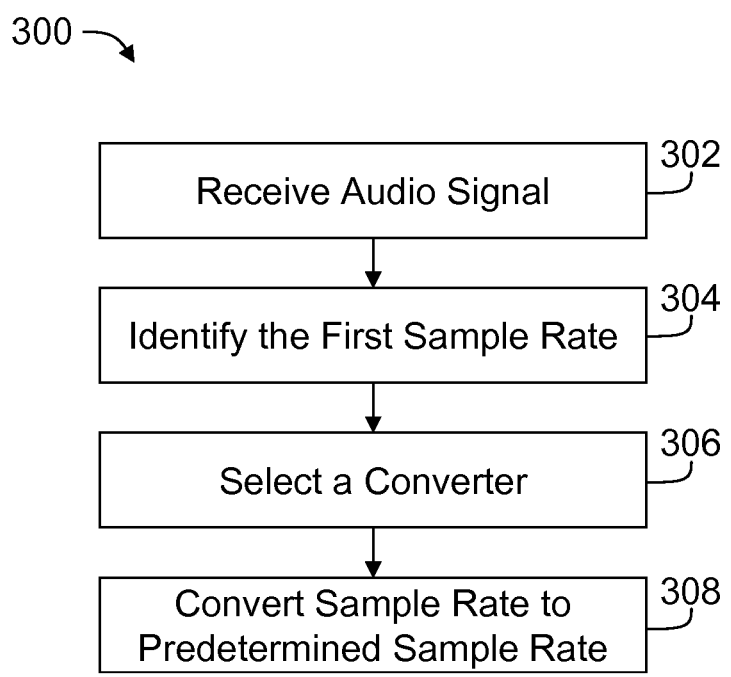

FIG. 3 is an exemplary flow chart illustrating a method 300 by which one or more of audio sample rate converter controllers (not shown in FIG. 3) and an audio sample rate conversion system (not shown in FIG. 3), such as audio sample rate conversion system 200 (not shown in FIG. 3), convert the sample rate of the audio signal received from a source, such as audio sample source 102 (not shown in FIG. 3), to output an audio signal at a predetermined output sample rate. An audio signal at a first sample rate is received 302 from audio sample source 102. The first sample rate of the audio signal is identified 304 and, based on the identification of the first sample rate of the audio signal, a converter is selected 306 from one or more audio sample rate converters 106, 108, and 110 (not shown in FIG. 3). The first sample rate of the audio signal is then converted 308 to a predetermined output sample rate. In the exemplary embodiment, conversion 308 is functionally equivalent to the conversion performed by converters 106, 108 and 110, as described above.

In the exemplary embodiment, the first sample rate is less than the predetermined output sample rate. Further, in the exemplary embodiment, the predetermined output sample rate is approximately 44.1 ksps, and the first sample rate is 11.025 ksps. In alternative embodiments, the first sample rate is one of approximately 8 ksps and approximately 22.05 ksps. In further alternative embodiments, the predetermined output sample rate and the first sample rate include any suitable sample rate known to those skilled in the art and guided by the teachings herein provided.

FIG. 4 illustrates an exemplary audio sample rate conversion system 400 for converting a first sample rate of one or more audio signals to a predetermined output sample rate such that computational resources are reduced while retaining an audio quality of audio signal. System 400 includes a controller 402 coupled to one or more audio sample sources, such as one or more of a 22.05 ksps source 404, an 11.025 ksps source 406, and an 8 ksps source 408. The one or more audio sample sources output one or more audio samples at a first sample rate to converter input selector 408. Selector 408 selects an audio sample converter from an audio sample converter group 410 for each audio signal received, and concurrently outputs each audio signal, at the first sample rate, to the converter in converter group 410 selected to convert the first sample rate of the audio signal to a predetermined output sample rate.

In the exemplary embodiment, converter group 410 includes one or more of each of converters 412, 414 and 416 that are each functionally equivalent, respectively, to converters 106, 108 and 110 (not shown in FIG. 4.) The output of conversion group 410 is selected using converter output selector 418 which outputs the audio signal at the predetermined output sample rate to one or more audio sample destinations 420. Further, in the exemplary embodiment, one or more audio sample destinations 420 are configured to receive the audio signal at the predetermined output sample rate of 44.1 ksps. In the exemplary embodiment, system 400 is configured to concurrently receive audio signals at one or more first sample rates from one or more audio sample sources 402, 404 and 406, and concurrently convert the first sample rate of each audio signal to the predetermined output audio sample rate for output to one or more audio sample destinations 420. Further, in the exemplary embodiment, converter output selector 418 is configured to select one or more outputs from conversion group 410 and concurrently output the one or more outputs to one or more audio sample destinations 420. In an alternative embodiment, system 400 converts each audio signal sequentially instead of concurrently.

Components of system 400 are schematically shown as blocks in FIG. 4. In the exemplary embodiment, one or more components of system 400 are implemented as software. In an alternative embodiment, one or more components of system 400 are each separate hardware components. In further alternative embodiments, one or more components of system 400 include any suitable combination of hardware and software known to those skilled in the art and guided by the teachings herein provided that are capable of performing the functions as described herein.

Exemplary embodiments of an audio sampling rate conversion system are described above in detail. The invention is not limited to the specific embodiments described herein. For example, the system supports many first sample rates and configures a converter to up-convert the sample rates of the received audio signals, whatever they may be, to the predetermined output sample rate, and thus the embodiments are not limited to practice with only the methods and systems as described herein. Rather, the embodiments can be implemented and utilized in connection with many other applications.

In the foregoing specification, it will be evident that various modifications and changes can be made thereto without departing from the broader spirit and scope of the invention. The specification and drawings are, accordingly, to be regarded in an illustrative rather than a restrictive sense.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A controller for outputting audio having a predetermined output sample rate, said controller comprising a hardware based first converter, a hardware based second converter, and a hardware based third converter, said controller programmed to:
   receive an audio signal having a first sample rate, wherein the first sample rate of the received audio signal includes a sample rate that is less than the predetermined output sample rate;
   identify the first sample rate of the audio signal;
   select one of the first converter, the second converter, and the third converter based on identification of the first sample rate, whereby a selected converter is identified; and
   convert the first sample rate of the received audio signal to the predetermined output sample rate using the selected converter;
   wherein the first converter is programmed to convert the first sample rate of the audio signal to the predetermined output sample rate by increasing the first sample rate by a factor equal to a ratio of the predetermined output sample rate to the first sample rate, and subsequently applying a first low-pass filter;
   wherein the second converter is programmed to convert the first sample rate of the audio signal to a second sample rate by increasing the first sample rate by a factor equal to a ratio of one-half of the predetermined output sample rate to the first sample rate, and subsequently applying a first low-pass filter; and
   convert the second sample rate of the audio signal to the predetermined output sample rate by increasing the second sample rate by the factor, and subsequently applying a second low-pass filter: and
   wherein the third controller is programmed to convert the first sample rate of the audio signal to the predetermined output sample rate by:
      converting the first sample rate to a second sample rate by increasing he first sample rate by a first factor equal to a least common numerator of a ratio of the predetermined output sample rate to the first sample rate and applying a first low-pass filter; and
      converting the second sample rate to the predetermined output sample rate by decreasing the second sample rate by a second factor equal to a least common denominator of the ratio; and
   filter the audio signal at the predetermined output sample rate by applying a first fast-Fourier transform (FFT) to the audio signal at the predetermined output sample rate; multiplying a result of the FFT application with a second fast-Fourier transform of a second low-pass filter; and applying an inverse fast-Fourier transform to the product.

2. A controller in accordance with claim 1, wherein the predetermined output sample rate is approximately 44.1 ksps and the first sample rate is one of approximately 8.0 ksps, approximately 11.025 ksps, and approximately 22.050 ksps.

3. An audio sample rate conversion system for outputting audio having a predetermined output sample rate, said audio sample rate conversion system comprising:
   an audio sample signal source;
   a hardware based first converter;
   a hardware based second converter;
   a hardware based third converter; and
   an audio controller coupled to said first converter, said second converter, said third converter, and to said audio sample signal source, said audio controller programmed to;
      receive the audio signal having a first sample rate from said audio sample signal source, wherein the first sample rate of the received audio signal includes a sample rate that is less than the predetermined output sample rate;
      identify the first sample rate of the audio signal;
      select a selected audio sample rate converter from said first converter, said second converter and said third converter based on identification of the first sample rate of the audio signal; and
      output the audio signal having the first sample rate to the selected audio sample rate converter;
   wherein the first converter is programmed to convert the first sample rate of the audio signal to the predetermined output sample rate by increasing the first sample rate by a factor equal to a ratio of the predetermined output sample rate to the first sample rate, and subsequently applying a first low-pass filter;
   wherein the second converter is programmed to convert the first sample rate of the audio signal to a second sample rate by increasing the first sample rate by a factor equal to a ratio of one-half of the predetermined output sample rate to the first sample rate, and subsequently applying a first low-pass filter; and
   convert the second sample rate of the audio signal to the predetermined output sample rate by increasing the second sample rate by the factor, and subsequently applying a second low-pass filter; and
   wherein the third controller is programmed to convert the first sample rate of the audio signal to the predetermined output sample rate by:
      converting the first sample rate to a second sample rate by increasing the first sample rate by a first factor equal to a least common numerator of a ratio of the predetermined output sample rate to the first sample rate and applying a first low-pass filter; and
      converting the second sample rate to the predetermined output sample rate by decreasing the second sample rate by a second factor equal to a least common denominator of the ratio; and filter the audio signal at the predetermined output sample rate by applying a first fast-Fourier transform (FFT) to the audio signal at the predetermined output sample rate; multiplying a result of the FFT application with a second fast-Fourier transform of a second low-pass filter; and applying an inverse fast-Fourier transform to the product.

4. An audio sample rate converter system in accordance with claim 3, wherein the predetermined output sample rate is approximately 44.1 ksps.

5. An audio sample rate converter system in accordance with claim 3, wherein the first sample rate of the audio sample is one of approximately 8.0 ksps, approximately 11.025 ksps, and approximately 22.050 ksps.

6. A method for converting a first sample rate of an audio signal to a predetermined output sample rate, said method comprising:
  receiving the audio signal having the first sample rate, wherein receiving the audio signal having a first sample rate comprises receiving the audio signal having a sample rate that is less than the predetermined output sample rate;
  identifying the first sample rate of the audio signal;
  selecting a selected converter from a first converter, a second converter, and a third converter based on the identification of the first sample rate of the audio signal; and
  converting, using the selected converter, the first sample rate of the audio signal to the predetermined output sample rate;
  wherein the first converter is programmed to convert the first sample rate of the audio signal to the predetermined output sample rate by increasing the first sample rate by a factor equal to a ratio of the predetermined output sample rate to the first sample rate, and subsequently applying a first low-pass filter;
  wherein the second converter is programmed to convert the first sample rate of the audio signal to a second sample rate by increasing the first sample rate by a factor equal to a ratio of one-half of the predetermined output sample rate to the first sample rate, and subsequently applying a first low-pass filter; and
  convert the second sample rate of the audio. signal to the predetermined output sample rate by increasing the second sample rate by the factor, and subsequently applying a second low-pass filter; and
  wherein the third controller is programmed to convert the first sample rate of the audio signal to the predetermined output sample rate by:
    converting the first sample rate to a second sample rate by increasing the first sample rate by a first factor equal to a least common numerator of a ratio of the predetermined output sample rate to the first sample rate and applying a first low-pass filter; and
    converting the second sample rate to the predetermined output sample rate by decreasing the second sample rate by a second factor equal to a least common denominator of the ratio; and
  filter the audio signal at the predetermined output sample rate by applying a first fast-Fourie transform (FFT) to the audio signal at the predetermined output sample rate; multiplying a result of the FFT applicationwith a second fast-Fourier transform of a second low-pass filter; and applying an inverse fast-Fourier transform to the product.

7. A method in accordance with claim 6, wherein converting the first sample rate of an audio signal to the predetermined output sample rate comprises converting the first sample rate to the predetermined output sample rate of approximately 44.1 ksps.

8. A method in accordance with claim 6, wherein receiving the audio signal having the first sample rate comprises receiving the audio signal having the first sample rate of one of approximately 8.0 ksps, approximately 11.025 ksps, and approximately 22.050 ksps.

\* \* \* \* \*